(12) United States Patent (10) Patent No.: US 8,810,258 B2
Bartlett et al. (45) Date of Patent: *Aug. 19, 2014

(54) SIGNAL ACQUISITION SYSTEM HAVING REDUCED PROBE LOADING OF A DEVICE UNDER TEST

(71) Applicants: Josiah A. Bartlett, Forest Grove, OR (US); Ira G. Pollock, Hillsboro, OR (US); Daniel G. Knierim, Beaverton, OR (US); Michael D. Stevens, Hillsboro, OR (US)

(72) Inventors: Josiah A. Bartlett, Forest Grove, OR (US); Ira G. Pollock, Hillsboro, OR (US); Daniel G. Knierim, Beaverton, OR (US); Michael D. Stevens, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/734,345

(22) Filed: Jan. 4, 2013

(65) Prior Publication Data

US 2013/0134999 A1 May 30, 2013

Related U.S. Application Data

(60) Division of application No. 12/846,745, filed on Jul. 29, 2010, now Pat. No. 8,564,308, which is a continuation-in-part of application No. 12/571,236, filed on Sep. 30, 2009, now abandoned.

(51) Int. Cl.
*G01R 35/00* (2006.01)

(52) U.S. Cl.
USPC ............................................ 324/601

(58) Field of Classification Search
USPC ....................................................... 324/601
See application file for complete search history.

(56) References Cited

U.S. PATENT DOCUMENTS

| 2,883,619 | A | * | 4/1959 | Kobbe et al. | 324/72.5 |
| 4,034,291 | A | * | 7/1977 | Allen et al. | 324/121 R |
| 4,260,951 | A | * | 4/1981 | Lewyn | 600/502 |
| 4,397,549 | A | * | 8/1983 | Morgan | 356/5.01 |

(Continued)

FOREIGN PATENT DOCUMENTS

| CN | 1338149 A | 2/2002 |
| CN | 101411155 A | 4/2009 |

OTHER PUBLICATIONS

Patrick A. McGovern, Nanosecond Passive Voltage Probes, IEEE Transaction on Instrumentation and Measurement, vol. IM-26, No. 1, Mar. 1977, pp. 46-52.

(Continued)

*Primary Examiner* — Benjamin M Baldridge
(74) *Attorney, Agent, or Firm* — William K. Bucher; Marger Johnson & McCollom PC

(57) ABSTRACT

A signal acquisition system has a signal acquisition probe having probe tip circuitry coupled to a resistive center conductor signal cable. The resistive center conductor signal cable of the signal acquisition probe is coupled to a compensation system in a signal processing instrument via an input node and input circuitry in the signal processing instrument. The signal acquisition probe and the signal processing instrument have mismatched time constants at the input node with the compensation system having an input amplifier with feedback loop circuitry and a shunt pole-zero pair coupled to the input circuitry providing pole-zero pairs for maintaining flatness over the signal acquisition system frequency bandwidth.

6 Claims, 10 Drawing Sheets

(56) References Cited

U.S. PATENT DOCUMENTS

| | | | |
|---|---|---|---|
| 4,634,986 A * | 1/1987 | Brookshier | 327/350 |
| 4,743,839 A * | 5/1988 | Rush | 324/72.5 |
| 4,996,497 A * | 2/1991 | Waehner | 330/151 |
| 5,172,051 A | 12/1992 | Zamborelli | |
| 5,274,336 A * | 12/1993 | Crook et al. | 324/690 |
| 5,472,561 A * | 12/1995 | Williams et al. | 438/10 |
| 6,226,322 B1 * | 5/2001 | Mukherjee | 375/229 |
| 6,307,363 B1 * | 10/2001 | Anderson | 324/72.5 |
| 6,347,288 B1 * | 2/2002 | Trammell et al. | 702/107 |
| 6,374,192 B1 * | 4/2002 | Brogle et al. | 702/107 |
| 6,483,284 B1 * | 11/2002 | Eskeldson et al. | 324/72.5 |
| 6,490,535 B1 * | 12/2002 | Hansen | 702/107 |
| 6,522,984 B1 | 2/2003 | Jordanov | |
| 6,710,959 B1 * | 3/2004 | Iroaga | 360/67 |
| 6,714,886 B2 * | 3/2004 | Sung et al. | 702/107 |
| 6,801,868 B1 * | 10/2004 | Medelius et al. | 702/107 |
| 6,856,126 B2 * | 2/2005 | McTigue et al. | 324/72.5 |
| 6,864,761 B2 | 3/2005 | Eskeldson et al. | |
| 6,870,359 B1 * | 3/2005 | Sekel | 324/750.02 |
| 7,257,505 B1 * | 8/2007 | Kurylak et al. | 702/107 |
| 7,679,422 B1 * | 3/2010 | Thiagarajan et al. | 327/337 |
| 8,036,762 B1 | 10/2011 | Young et al. | |
| 8,278,940 B2 | 10/2012 | Bartlett et al. | |
| 2003/0154045 A1 * | 8/2003 | Sung et al. | 702/107 |
| 2003/0161420 A1 | 8/2003 | Pupalaikis | |
| 2004/0008043 A1 * | 1/2004 | Thomas et al. | 324/715 |
| 2004/0075510 A1 | 4/2004 | Eskeldson et al. | |
| 2004/0140819 A1 | 7/2004 | McTigue et al. | |
| 2004/0249485 A1 * | 12/2004 | Bondarev et al. | 700/71 |
| 2005/0080831 A1 | 4/2005 | Pickerd et al. | |
| 2005/0134368 A1 * | 6/2005 | Chandrasekaran | 330/9 |
| 2005/0253651 A1 * | 11/2005 | Quek | 330/107 |
| 2006/0074607 A1 | 4/2006 | Weller | |
| 2007/0126501 A1 * | 6/2007 | Kim et al. | 330/86 |
| 2007/0159196 A1 * | 7/2007 | Hayden et al. | 324/754 |
| 2008/0048778 A1 * | 2/2008 | Lee et al. | 330/253 |
| 2009/0063072 A1 | 3/2009 | Sullivan et al. | |
| 2009/0134893 A1 | 5/2009 | Frame et al. | |
| 2010/0007419 A1 * | 1/2010 | Gilbert | 330/254 |
| 2010/0042338 A1 * | 2/2010 | Giurgiutiu et al. | 702/39 |
| 2011/0074389 A1 | 3/2011 | Knierim et al. | |
| 2011/0074392 A1 | 3/2011 | Bartlett et al. | |
| 2011/0074441 A1 | 3/2011 | Bartlett et al. | |

OTHER PUBLICATIONS

U.S. Appl. No. 12/846,721, filed Jul. 29, 2010, titled "Signal Acquisition System Having Reduced Probe Loading of a Device Under Test".

U.S. Appl. No. 12/846,742, filed Jul. 29, 2010, titled "Signal Acquisition System Having a Compensation Digital Filter".

U.S. Appl. No. 12/846,750, filed Jul. 29, 2010, titled "Signal Acquisition System Having Probe Cable Termination in a Signal Processing Instrument".

U.S. Appl. No. 12/571,236, filed Sep. 30, 2009, titled "Low Capacitance Signal Acqusition System".

Preliminary Amendment, filed Aug. 9, 2010, for U.S. Appl. No. 12/846,742, filed Jul. 29, 2009, titled "Signal Acquisition System Having a Compensation Digital Filter".

Preliminary Amendment, filed Aug. 9, 2010, for U.S. Appl. No. 12/846,721, filed Jul. 29, 2010, titled "Signal Acquisition System Having Reduced Probe Loading of a Device Under Test".

Preliminary Amendment, filed Aug. 9, 2010, for U.S. Appl. No. 12/846,750, filed Jul. 29, 2010, titled "Signal Acquisition System Having Probe Cable Termination in a Signal Processing Instrument".

U.S. Appl. No. 12/571,236, filed Sep. 30, 2009, titles "Low Capacitance Signal Acquisition System.".

U.S. Appl. No. 12/846,745, filed Jun. 29, 2010, titled "Signal Acquisition System Having Reduced Probe Loading of a Device Under Test.".

Preliminary Amendment, filed Aug. 9, 2010 in U.S. Appl. No. 12/846,745, filed Jun. 29, 2010, titled "Signal Acquisition System Having Reduced Probe Loading of a Device Under Test.".

Office Action, Notification Date May 3, 2012, for U.S. Appl. No. 12/846,721, filed Jun. 29, 2010, titles "Signal Acquisition System Having Reduced Probe Loading of a Device Under Test".

Office Action, Notification Date May 4, 2012, for U.S. Appl. No. 12/846,745, filed Jun. 29, 2010, titled "Signal Acquisition System Having Reduced Probe Loading of a Device Under Test".

Office Action, Notification Date May 17, 2012, for U.S. Appl. No. 12/846,750, filed Jun. 29, 2010, titles "Signal Acquisition System Having Reduced Probe Loading of a Device Under Test".

Jun Qin, Huang: "Design Method for a Dynamically Compensated Digital Filter", Chinese Journal of Scientific Instrument, vol. 8, No. 3, Aug. 31, 1987, pp. 330-335. Translation of Introduction only.

Zhengshi, Liu: "Design Method and Application of a Digital Filter", China Mechanical Engineering, vol. 17, No. 1, Jan. 31, 2006, pp. 88-91. Abstract Only.

CN Search Report for Application No. 201010501769.3, dated Feb. 19, 2014, State Intellectual Property Office of People's Republic of China.

\* cited by examiner

SIGNAL ACQUISITION SYSTEM HAVING REDUCED PROBE LOADING OF A DEVICE UNDER TEST

CROSS REFERENCE TO RELATED APPLICATION

This Divisional patent application clams priority from Continuation-in-Part application Ser. No. 12/846,745, filed Jul. 29, 2010 which claims priority from U.S. patent application Ser. No. 12/571,236, filed Sep. 30, 2009.

BACKGROUND OF THE INVENTION

The present invention relates generally to acquiring a signal from a device under test and more particularly to a signal acquisition system having reduced loading of the device under test using a signal acquisition probe with reduced capacitance.

Traditional passive voltage probes 10 generally consist of a resistive-capacitive parallel network 12 at the probe tip 14, shown as $R_T$ and $C_T$ in FIG. 1, coupled via a resistive center conductor signal cable 16 to compensation circuitry 18 in a compensation box. The compensation circuitry 18 has resistive elements $R_{C1}$ and $R_{C2}$ and capacitive element $C_C$. $R_{C1}$ is in series with the cable 16 and $R_{C2}$ is in series with variable capacitor $C_C$. The compensation circuitry 18 is coupled to input circuitry 20 of a measurement test instrument 22, such as an oscilloscope, spectrum analyzer, logic analyzer and the like. Generally, the input circuitry 20 of an oscilloscope includes an input resistive-capacitive network 24, shown as $R_{TS}$ and $C_{TS}$, that is associated with switching input attenuation circuitry (not shown) that provides an input impedance for the oscilloscope of 1 MΩ in parallel with 10 to 20 picofarad (pf) of capacitance. The output of the switching input attenuation circuitry is coupled to the input of a preamplifier 26. The oscilloscope is calibrated to provide a nominally flat frequency response transfer function from the input of the oscilloscope to the output of the preamplifier.

The compensation circuitry 18 provides resistive and capacitive termination of the cable 16 to minimize reflections and provides a transfer function having a nominally flat frequency response to the measurement test instrument 22. The variable compensation capacitor $C_C$ is user adjustable to match the capacitive and resistive divider ratios of the probe over variations in the input capacitance of individual oscilloscope channels. Resistive element $R_{C1}$ provides resistive cable 16 termination matching into the oscilloscope input at high frequencies (where cable $Z_0 \approx 155\Omega$). $R_{C2}$ in series with variable capacitor $C_C$ improves the cable termination into the capacitive load in the oscilloscope.

The tip resistance $R_T$, cable termination resistor $R_{C1}$ and the input resistance $R_{TS}$ form a voltage divider attenuation network for DC to low frequency input signals. To accommodate a wide frequency range of input signals, the resistive voltage divider attenuation network is compensated using a shunt tip capacitor $C_T$ across the tip resistive element $R_T$ and a shunt termination capacitor $C_C$ and the input capacitor $C_{TS}$ across termination resistive element $R_{TS}$. To obtain a properly compensated voltage divider, the time constant of the probe tip resistive-capacitive parallel network 12 must equal the time constant of the termination resistive-capacitive parallel network 24 including $C_{cable}$ and $C_C$.

Properly terminating the resistive cable 16 in its characteristic impedance requires adding a relatively large shunt capacitance $C_C$ to the compensation network 18. This is in addition to the bulk cable capacitance $C_{CABLE}$. For example, the tip resistance $R_T$ and capacitance $C_T$ for a P2222 10× Passive Probe, manufactured and sold by Tektronix, Inc., Beaverton, Oreg., is selected to give a 10× divide into the oscilloscope's input impedance of 1 MΩ. The minimum tip capacitance $C_T$, neglecting any other parasitic capacitance, is one ninth of the sum of the cable bulk capacitance $C_{CABLE}$, $C_C$ and $C_{TS}$. The tip capacitance of $C_T$ is on the order of 8 pF to 12 pf for the above stated parameters. The input capacitance (which is $C_T$ in series with the sum of $C_{CABLE}$, $C_C$ and $C_{TS}$) is driven by the circuit being monitored and therefore represents a measure of how much the probe loads the circuit.

FIG. 2 illustrates another passive voltage probe and oscilloscope configuration where the preamplifier 28 is configured as a current amplifier. This configuration has the same limitations as the probe and oscilloscope configuration of FIG. 1. The probe has compensation circuitry in the probe compensation box and the oscilloscope has the traditional 1 MΩ resistance in parallel with 10 to 20 pf of capacitance at the oscilloscope input. A major drawback to existing passive voltage probe and oscilloscope configurations is that a substantial portion of the mid-band and high-band frequency signal current at the output of the resistive center conductor signal cable is shunted to ground by the termination capacitor $C_C$. In addition, since the resistive center conductor signal cable is terminated prior to the oscilloscope input, the parasitic capacitance of the input circuitry of the oscilloscope acts as a non-terminated transmission line which shunts additional current to ground.

The probe tip capacitance and the resistive center conductor signal cable affect the overall bandwidth of a traditional passive probe. Further, the probe tip input presents low input impedance to a device under test at high frequencies due to the low capacitive reactance in parallel with the high input resistance. Reducing the probe tip capacitance to increase the capacitive reactance requires adjustment of the other component values of the voltage divider network to maintain a compensated network. Previously, this has been accomplished by increasing the resistance in the probe tip. However, this increases the divider ratio of the network with a resulting increase in the attenuation of signal applied to the probe. The decreased signal input to the oscilloscope may be compensated for by increasing the gain of the oscilloscope input circuits which results in an increase in the noise on the signal reducing the overall signal-to-noise ratio of the instrument.

A special type of passive probe exists that provides a relatively high impedance and attenuation into a 50 ohm input oscilloscope. The $Z_0$ probe has a relatively low input resistance, 5 kilo ohms or less, coupled to a 50 ohm lossless coaxial cable. The capacitance at the probe tip is generally less than 1 pf produced by the parasitic capacitance of the probe head. In a specific embodiment, the probe tip resistance is 450 ohm coupled via the 50 ohm lossless coaxial cable to the 50 ohm input of the oscilloscope, which produces a 10× passive voltage divider network. The voltage input to this probe is limited as compared to the traditional passive probe due to the size of the input resistor. Also, the low input resistance can cause excessive loading to DC signals.

U.S. Pat. No. 6,483,284, shown in FIG. 3, teaches a wideband probe using pole-zero cancellation. A parallel probe tip network of resistor $R_{tip}$ and capacitor $C_{tip}$ in series with resistor $R_{tab}$ and capacitor $C_{tab}$ detects a signal from a device under test and couples the signal to a compensation network via a near lossless coaxial cable 40. The capacitor $C_{tab}$ represents the capacitance in the tip circuit, such as a trace on a circuit board, a coaxial cable or the like. A cable termination resistor $R_e$ is connected in series between the cable 40 and an inverting input terminal of an operational amplifier 42. The non-inverting input is coupled to a common ground. Connected between the input terminal and the output terminal of the operational amplifier 42 is a parallel combination of a resistor $R_{fb}$ and a capacitor $C_{fb}$ with resistor $R_{pk}$ in series with $C_{fb}$. The parallel tip resistor $R_{hp}$ and capacitor $C_{hp}$ create a zero and the combination of resistor $R_{tab}$ and capacitor $C_{tab}$ create a pole. A pole is created by resistor $R_{fb}$ and capacitor $C_{fb}$ in the compensation network and a zero is created by resistor $R_{pk}$ and capacitor $C_{fb}$. The zero and pole created in the probe tip network are cancelled by the pole and zero in the compensation network. The output of the compensation network is coupled to an end user device, such as an oscilloscope or the like. The teaching states that the time constants of the two RC networks must be equal so that the zeros and poles balance out and the probe has a constant gain. Further, the operational amplifier 42 is part of the wideband probe circuitry and not part of the end user device.

SUMMARY OF THE INVENTION

Accordingly, the present invention is a signal acquisition system having a signal acquisition probe and a signal processing instrument. The signal acquisition probe has probe tip circuitry coupled to a resistive center conductor signal cable. The resistive center conductor signal cable is coupled to an input node of the signal processing instrument. The input node is further coupled to a compensation system disposed in the signal processing instrument via input circuitry. The signal acquisition probe and the signal processing instrument have mismatched time constants at the input node with the compensation system having an input amplifier with feedback loop circuitry and a shunt pole-zero pair coupled to the input circuitry providing pole-zero pairs for maintaining flatness over the signal acquisition system frequency bandwidth.

The input amplifier may be a current amplifier with the feedback loop circuitry having a first series coupled resistive element and capacitive element, a second series coupled resistive element and capacitive element, and a third resistive element with the first and second series coupled resistive elements and capacitive elements and the third resistive element in parallel with each other. A plurality of registers may be used for setting resistive values and capacitive values of respective resistive and capacitive elements in the feedback loop circuitry. The first series coupled capacitive and resistive elements in parallel with the second series coupled capacitive and resistive elements form a split pair of poles and zeros. The resistive element of the shunt pole-zero pair may be an electronically controlled variable resistor.

The input circuitry of the signal processing instrument is preferably attenuation circuitry that provides at least one of resistive and capacitive termination of the resistive center conductor signal cable. The input node is coupled to a signal path that has the other end coupled to a resistive element disposed adjacent to the input of the input amplifier forming a terminated transmission line. A switching circuit is disposed in the signal processing instrument for selectively coupling the input node to the compensation system via the attenuation circuitry and the shunt pole-zero pair to the attenuation circuitry and for selectively coupling a resistive-capacitive network between the input node and the attenuation circuitry and decoupling the shunt pole-zero pair from the attenuation circuitry.

The probe tip circuitry has at least a first resistive element in parallel with a capacitive element. The probe tip circuitry may also have a plurality of first resistive elements in parallel with a plurality of capacitive elements to form a high voltage signal acquisition probe. The capacitive element or elements have an effective capacitance in the range of 2 to 5 picofarads.

A calibration process for the signal acquisition system includes the steps of acquiring digital values of a broad frequency content signal as a calibration waveform using the signal acquisition probe and the signal processing instrument and determining a measured error value between a broad frequency content signal reference calibration waveform stored in the signal processing instrument and the calibration waveform at a common location on the waveforms. A measured error factor is determined having at least one of a register value and an adjustable resistive element value as a function of the measured error value at the common location. The register value and/or the adjustable resistive element value of the measured error factor is applied to at least one of an appropriate feedback loop register in a plurality of registers in feedback loop circuitry of an input amplifier and an adjustable resistive element in the shunt pole-zero pair. The measured error value and the measured error factor for each common location of the calibration waveform and the calibration reference waveform are then determined. Alternately, a plurality of first measured error values are determined between the broad frequency content signal reference calibration waveform stored in the signal processing instrument and the calibration waveform at common locations on the waveforms set by at least one of time locations and frequency locations, and a measured error factor is determined as a function of the plurality of first measured error values and the common locations on the waveforms. After the measured error value and the measured error factor has been determined for the last common location on the calibration waveform and the calibration reference waveform, a new set of digital values of the broad frequency content signal are acquired as the calibration waveform. The new calibration waveform is compared with calibration specifications to verify the calibration. If the calibration is within the calibration specifications, the register values in the plurality of registers in feedback loop circuitry of the input amplifier and the adjustable resistive element value are stored and the successful result of the calibration process is displayed.

If the calibration waveform is not within the calibration specifications, then a determination is made on whether the calibration process has exceeded an iteration time limit value. If the calibration process has not exceeded an iteration time limit value, then the common location on the waveforms is set to the initial location. The measured error value or values and the measured error factor for each common location or locations of the calibration waveform and the calibration reference waveform is then determined and at least one of the resister value and the adjustable resistive element value of the measured error factor is applied to at least one of an appropriate feed back loop register in a plurality of registers in feedback loop circuitry of the input amplifier and the adjustable resistive element of the shunt pole-zero pair. After the measured error value and the measured error factor has been determined for the last common location on the calibration waveform and the calibration reference waveform, a new set of digital values of a broad frequency content signal are acquired as the calibration waveform. The new calibration waveform is compared with calibration specifications to verify the calibration. If the new calibration waveform is still not within the calibration specifications and the calibration process has timed out, then the initial values in the plurality of registers in the feedback loop circuitry of the input amplifier and the initial adjustable resistive element value of the shunt pole-zero pair prior to the calibration process are stored, and the unsuccessful result of the calibration process is displayed.

The acquiring of the digital values of the broad frequency content signal as the calibration waveform includes the additional steps of attaching the signal acquisition probe to the signal processing instrument. The signal processing instrument detects the presence or absence of a probe memory in the signal acquisition probe, and loads stored contents of probe memory into the signal processing instrument if the probe memory is present. The signal processing instrument detects the presence of probe calibration constants stored in the probe memory, and applies the probe calibration constants to appropriate register values in the plurality of registers in the in feedback loop circuitry of the input amplifier and the appropriate adjustable resistive element value of the shunt pole-zero pair. If the signal acquisition probe does not have a probe memory, then nominal register values are applied to the plurality of registers in the in feedback loop circuitry of the input amplifier and the nominal adjustable resistive element value is applied to adjustable resistive element of the shunt pole-zero pair.

The objects, advantages and novel features of the present invention are apparent from the following detailed description when read in conjunction with appended claims and attached drawings.

BRIEF DESCRIPTION OF THE DRAWING FIGURES

DESCRIPTION OF THE INVENTION

Figure 4:
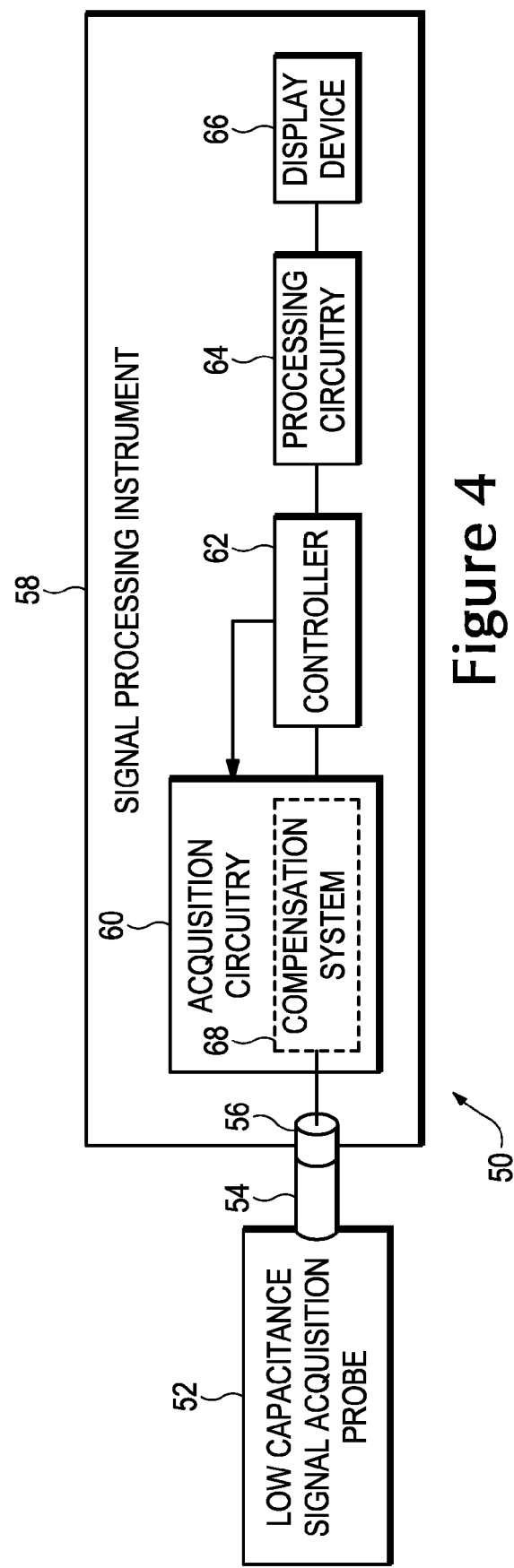
FIG. 4 is a block diagram of a signal acquisition system according to the present invention.

Referring to FIG. 4, there is shown a high level block diagram of a signal acquisition system 50 having reduced probe loading of a device under test according to the present invention. The signal acquisition system 50 has a signal acquisition probe 52 that includes a resistive center conductor signal cable 54. The signal cable is coupled to an input node 56 of a signal processing instrument 58. The input node 56 is also coupled to acquisition circuitry 60 in the signal processing instrument 58. The acquisition circuitry 60 generates digital values of an input signal from the signal acquisition probe 52. The digital values of the input signal are coupled to a controller 62 for further processing. The controller 62 may couple the digital values to processing circuitry 64 for formatting the digital values and displaying the formatted digital values on a display device 66.

In traditional probe-oscilloscope systems, each stage of the signal path is compensated for a flat frequency and phase response. The oscilloscope is calibrated to provide a nominally flat frequency response. The signal acquisition probe is attached to the oscilloscope and the probe is calibrated using termination and compensation circuitry in the probe to produce a nominally flat frequency response relative to the oscilloscope input. The resulting probe-oscilloscope system has time constant matching of the signal acquisition probe and the oscilloscope input to produce a flat frequency response over the probe oscilloscope system bandwidth. In the present invention, the high frequency input impedance of the signal acquisition probe 52 at a device under test is increased by reducing the input capacitance of the signal acquisition probe 52. The resulting structure of the present invention mismatches the time constants of the probe tip circuitry of the signal acquisition probe 52 and the circuitry across the input node 56 of the signal processing instrument 58. A compensation system 68 in the acquisition circuitry 60 provides pole-zero pairs that flatten the frequency response of the signal acquisition system 50 resulting from the mismatched time constants.

Figure 5:
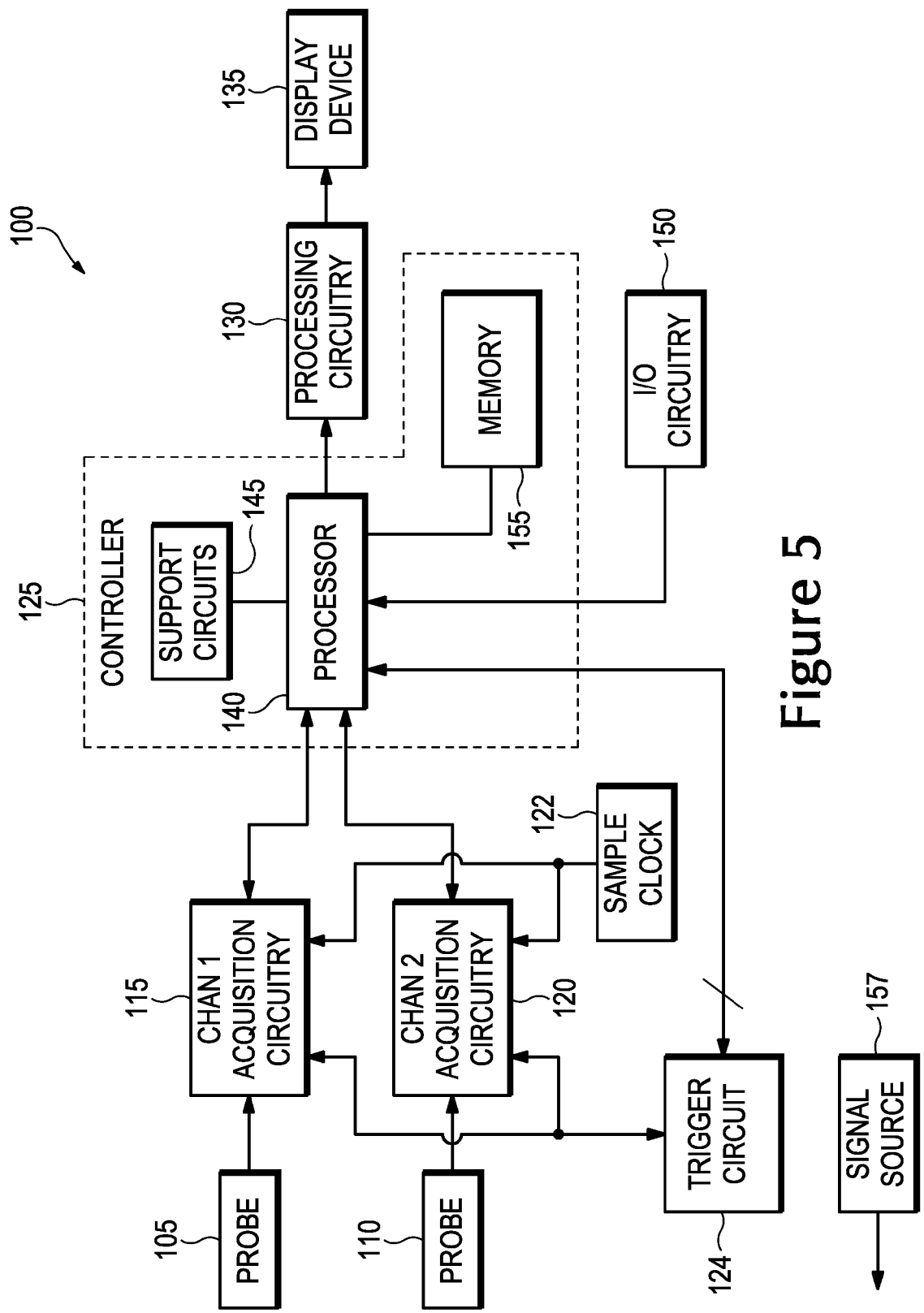
FIG. 5 is a representative block diagram of a signal processing instrument in a signal acquisition system according to the present invention.

The signal processing instrument 58 of the present invention, such as an oscilloscope, logic analyzer, digitizer and the like, will be described below with respect to a digital oscilloscope. FIG. 5 depicts a high level block diagram of a digital oscilloscope 100 used as part of the signal acquisition system 50 of the subject invention. Generally, oscilloscopes 100 include multiple signal channels with each signal channel having an input on which are connected various types of signal acquisition probes 105, 110, such as passive and active voltage probes, current probes, and the like, for acquiring electrical signals from a device under test (DUT). The oscilloscope 100 signal channel inputs are coupled to respective signal channel acquisition circuitry 115, 120. The respective acquisition circuitry 115, 120 sample their respective input signals in accordance with a sample clock provided by an internal sample clock generator 122.

The acquisition circuitry 115, 120 each include a preamplifier, analog-to-digital conversion circuitry, triggering circuitry, decimator circuitry, supporting acquisition memory, and the like. The acquisition circuitry 115, 120 operate to digitize, at a sample rate, one or more of the signals under test to produce one or more respective sample streams suitable for use by controller 125 or processing circuitry 130. The acquisition circuitry 115, 120, in response to commands received from the controller 125, changes preamplifier feedback values; trigger conditions, decimator functions, and other acquisition related parameters. The acquisition circuitry 115, 120 communicates its respective resulting sample stream to the controller 125.

A trigger circuit 124 is shown separate from the acquisition circuitry 115, 120 but one skilled in the art will realize that it could be internal to the acquisition circuitry 115, 120. The trigger circuit 124 receives trigger parameters, such as trigger threshold level, hold off, post trigger acquisition, and the like, from the controller 125 in response to user input. The trigger circuit 124 conditions the acquisition circuitry 115, 120 for capturing digital samples of the signal under test from the DUT.

The controller 125 operates to process the one or more acquired sample streams provided by the acquisition circuitry 115, 120 to generate respective sample stream data associated with one or more sample streams. That is, given desired time per division and volts per division display parameters, controller 125 operates to modify or rasterize the raw data associated with an acquired sample stream to produce corresponding waveform data having the desired time per division and volts per division parameters. The controller 125 may also normalize waveform data having non-desired time per division, volts per division, and current per division parameters to produce waveform data having the desired parameters. The controller 125 provides the waveform data to processing circuitry 130 for subsequent presentation on display device 135.

The controller 125 of FIG. 5 preferably comprises a processor 140, such as a PowerPC™ Processor, manufactured and sold by Motorola, Inc., Schaumburg, Ill., support circuits 145 and memory 155. Processor 140 cooperates with conventional support circuitry 145, such as power supplies, clock circuits, cache memory, buffer/expanders, and the like, as well as circuits that assist in executing software routines stored in memory 155. As such, it is contemplated that some of the process steps discussed herein as software processes may be implemented within hardware, for example, as circuitry that cooperates with processor 140 to perform various steps. Controller 125 also interfaces with input/output (I/O) circuitry 150. For example, I/O circuitry 150 may comprise a keypad, pointing device, touch screen, or other means adapted to provide user input and output to the controller 125. The controller 125, in response to such user input, adapts the operations of acquisition circuitry 115, 120 to perform various data acquisitions, triggering, processing, and display communications, among other functions. In addition, the user input may be used to trigger automatic calibration functions or adapt other operating parameters of display device 135, logical analysis, or other data acquisition devices.

Memory 155 may include volatile memory, such as SRAM, DRAM, among other volatile memories. Memory 155 may also include non-volatile memory devices, such as a disk drive or a tape medium, among others, or programmable memory, such as an EPROM, among others. A signal source 157 generates a broad frequency content signal for probe compensation. In the preferred embodiment of the present invention, the broad frequency content signal is a fast edge square wave. Alternately, the signal source 157 may be a leveled variable frequency sine-wave generator.

Although Controller 125 of FIG. 5 is depicted as a general purpose computer that is programmed to perform various control functions in accordance with the present invention, the invention may be implemented in hardware such as, for example, an application specific integrated circuit (ASIC). As such, it is intended that processor 125, as described herein, be broadly interpreted as being equivalently performed by hardware, software, or by a combination thereof.

Figure 6:
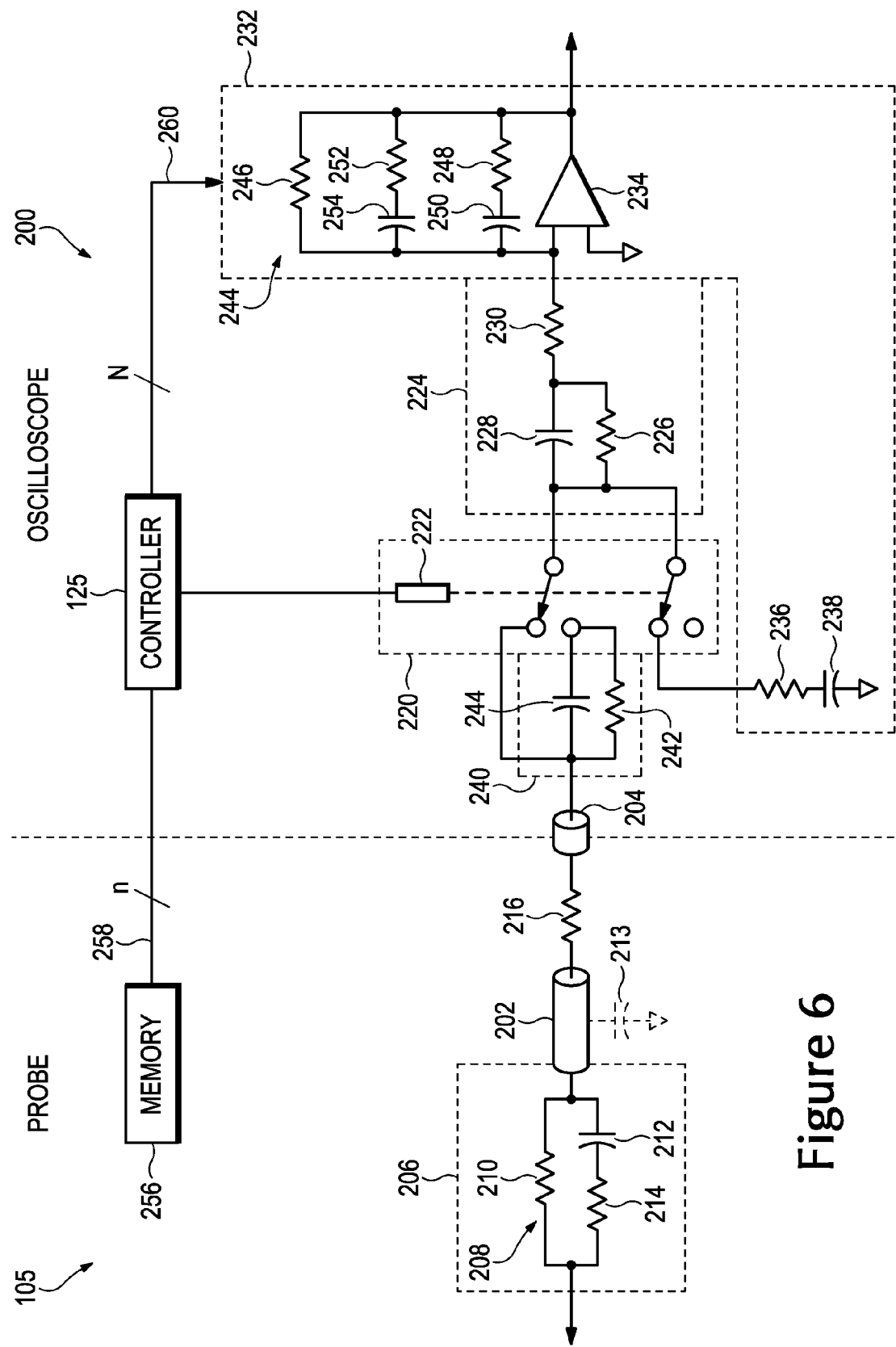
FIG. 6 is a representative schematic diagram of a signal acquisition system according to the present invention.
Figure 7:
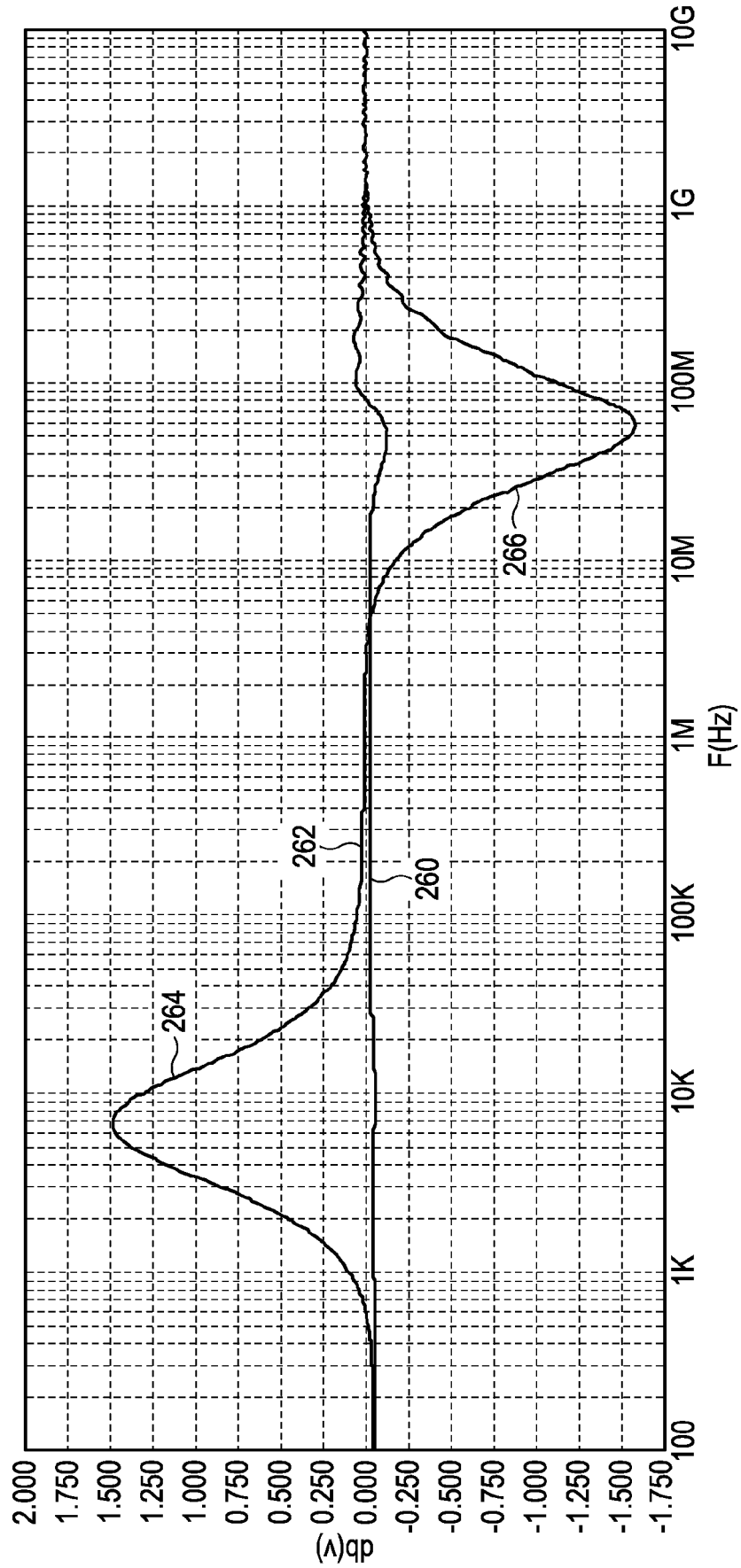
FIG. 7 shows representative frequency responses of a signal acquisition system with and without crossover compensation.

FIG. 6 is a representative schematic diagram of a signal acquisition system 200 according to the present invention. Like elements from FIG. 5 are labeled the same in FIG. 6. The signal acquisition probe 105 has a probing head 206 containing probe tip circuitry 208, a resistive center conductor signal cable 202, and a resistor element 216. The probe tip circuitry 208 has a resistive element 210 coupled in parallel with a capacitive element 212 that is in series with a resistive element 214. The capacitive element 212 has a capacitance in the range of 2-5 picofarads (pf) to provide a low input capacitance to a device under test. The probe tip circuitry 208 is coupled to one end of the resistive center conductor signal cable 202. The other end of the resistive center conductor signal cable 202 is coupled to a BNC input node 204 of one of the signal acquisition circuitry 115, 120 in the digital oscilloscope 100 via the resistive element 216. The resistive center conductor signal cable is preferably a coaxial cable having a resistive center conductor with a resistance of 39 Ω/ft. The resistive center conductor signal cable 202 has a capacitance to ground, which is shown by capacitor 213. The BNC input node 204 is coupled to a switching circuit 220 which in turn provides coupling of the signal acquisition probe 105 to input circuitry 224. The resistive element 216 in combination with resistive element 230 in the input circuitry 224, representatively shown as attenuation circuitry consisting of resistive element 226 in parallel with capacitive element 228, terminate the resistive center conductor signal cable 202 in its characteristic resistive impedance. In the preferred embodiment of the invention, the termination capacitance of the resistive center conductor signal cable 202 is approximately 40 pf and the termination resistance is approximately 150Ω. In addition, a 1.2 meter resistive center conductor signal cable 202 has, by coincidence, a capacitance to ground of approximately 40 pf. The capacitance to ground of the resistive center conductor signal cable 202 can be easily changed by changing the length of the cable. The resistive element 216 has a resistive value of 100Ω and resistive element 230 has a resistive value of 50Ω. The resistive element 230 is physically located as close as possible to the input of input amplifier 234, functioning as a current amplifier, to reduce the non-terminated parasitic capacitance of the signal trace between the BNC input node 204 and the input amplifier 234. The BNC and signal trace here are assumed to be designed to a characteristic impedance of 50Ω so as to be properly terminated by resistive element 230. The input circuitry 224 also terminates the resistive center conductor signal cable 202 in its characteristic capacitive impedance.

The switching circuit 220 has a switching element 222 having double pole contacts. The switching element 222 has a first set of contacts that selectively couple the probe tip circuitry 208 to compensation system 232 via the input circuitry 224 or couple a resistor-capacitor attenuator network 240 between the probe tip circuitry 208 and the input circuitry 224. A second set of contacts selectively couples a ground connected shunt pole-zero pair of the compensation system 232, consisting of resistive element 236 and capacitive element 238, to the input circuitry 224 or uncouples the series connected resistive element 236 and capacitive element 238 from the input circuitry 224. The resistive-capacitive attenuator network 240 provides backward compatibility for legacy signal acquisition probes requiring a 1 MΩ oscilloscope input impedance. The switching element 222 is preferably a relay switch receiving switching commands from controller 125.

The signal acquisition probe 105 preferably has a memory 256 containing information about the probe, such as probe type, serial number, and the like, and may also contain probe calibration data. The probe memory 256 is preferably a one wire EEPROM, manufactured and sold by Maxim Integrated Products, Inc., Sunnyvale, Calif. under Part No. DS2431. The probe memory 256 is coupled to the controller 125 via a one line communications/power line 258. Alternately, the probe memory 256 may communicate with the controller 125 via multi line communications bus, such as an I²C bus, a Firewire bus and the like.

Moving the resistive and capacitive terminations of the resistive center conductor signal cable 202 into the signal processing instrument 100 substantially reduces the amount of mid-band and high-band frequency signal current being shunted to ground at the output of the resistive center conductor signal cable 202. In the prior art resistive center conductor signal cable passive voltage probes, a substantial portion, on the order of two-thirds of the mid-band and high-band signal current at the output of the probe cable, is shunted to ground by the termination capacitor in the probe compensation box depending on the termination capacitance of the cable and the parasitic capacitance of the oscilloscope input. Also, the resistive center conductor signal cable of the prior art is terminated in the compensation box of the probe which results in the parasitic capacitance in the input of the oscilloscope acting as a non-terminated stub, further shunting additional current to ground. In the present invention, the resistive and capacitive terminations in the input circuitry 224 are in series with the resistive center conductor signal cable 202 and the input of the input amplifier 234, resulting in substantially greater current flow into the input of the amplifier. The probe tip capacitance can be reduced to values in the range of 2-5 pf which reduces the mid-band and high-band frequency signal current at the output of the resistive center conductor signal cable 202. This decrease in signal current is offset by an overall increase in signal current provided to the input current amplifier resulting in a signal-to noise ratio equivalent to existing passive voltage probes. Additionally, the resistive element 230 terminating the signal path from the BNC input node 204 to the input amplifier 234 in conjunction with parasitic inductance and capacitance of the signal path essentially transforms the signal path into a terminated transmission line which further diminishes the amount of signal current shunted to ground. The results of moving the resistive and capacitive cable termination into the oscilloscope 100 and terminating the signal path in the instrument are that greater than fifty percent of the mid-band and high-band frequency signal current at the output of the resistive center conductor signal cable 202 is coupled to the input amplifier 234 and an increase in the bandwidth of the signal acquisition system due to the elimination of the non-terminated stub between the BNC input node 204 and the input amplifier 234.

The termination resistance and capacitance of the resistive center conductor signal cable 202 are fixed values for a given cable type where as the capacitance to ground of the resistive center conductor signal cable 202 varies with the length of the cable. In the preferred embodiment of the invention, the termination capacitance of the resistive center conductor signal cable 202 is approximately 40 pf and the termination resistance is approximately 150Ω. In addition, a 1.2 meter resistive center conductor signal cable 202 has, by coincidence, a capacitance to ground of approximately 40 pf. The capacitance to ground of the resistive center conductor signal cable 202 can be easily changed by changing the length of the cable. The resistive element 210 in the probe tip circuitry 208 has a value of 9.75 MΩ and the capacitive element 212 has a value of 3.4 pf. The capacitive value is lower than existing resistive center conductor passive voltage probes which generally have a capacitance in the range of 8 to 14 pf. Reducing the input capacitance at the probe tip reduces the capacitive loading of the device under test resulting in a wider probe bandwidth. The time constant for the probe tip circuitry 208 using the above values is 33.15 μsec. The time constant across the BNC input node 204 should match the time constant of the probe tip circuitry 208. Limitations are placed on the capacitive element 228 in the input circuitry 224 in that its capacitance should match the termination capacitance of the resistive center conductor signal cable 202. Therefore, the capacitance of capacitive element 228 is 40 pf. The capacitance to ground of the resistive center conductor signal cable 202, which is 40 pf, needs to added to the termination capacitance. The resulting capacitance at the BNC input node 204 is 80 pf. The probe tip circuitry 208 time constant is divided by the 80 pf value of the summed capacitive value of the termination capacitance and the capacitance to ground of the resistive center conductor signal cable 202 should result in a value of 414.4 kΩ for the resistive element 226 of the input circuit 224. However, the need for backward compatibility with legacy probes and a requirement to directly drive the oscilloscope input requires the oscilloscope input capacitance be in the range of 10-20 pf. The parasitic capacitance at the input of the oscilloscope is approximately 2 pf. The optimal value of the effective capacitance of the capacitive elements 228 and 244 is preferably between 10 and 12 pf. The value of capacitive element 228 is set at 40 pf to match the capacitance of the resistive center conductor signal cable 202. The value of capacitive element 244 needs to be approximately 13.3 pf to produce an effective capacitance of about 10 pf. The ratio of the capacitive element 228 to capacitive element 244 is 3:1 requiring a 1:3 ratio for the resistive element 226 and resistive element 242. The values of the resistive elements 226 and 242 need to add-up to 1 MΩ for backward compatibility resulting in the resistive element 226 having a value of 250 kΩ and the resistive element 242 having a value of 750 kΩ. The resulting time constants for the input circuitry 224 and the resistive-capacitive attenuator network 240 are 10 μsec. With the time constant of the input circuitry 224 set at 10 μsec, the time constant across the BNC input node 204 is nominally 20 μsec (80 pf times 250 kΩ) and the time constant of the probe tip circuitry 208 is 33.15 μsec. The compensation circuitry 224 has split pole-zero pairs that compensate for the mismatched time constants across the BNC input node of the oscilloscope 100.

The compensation system 232 further includes an input amplifier 234 that has its inverting input coupled to the attenuation circuitry 224 and the non-inverting input coupled to ground. The input amplifier 234 of the compensation system 232 has feedback loop circuitry 244 that preferably includes an adjustable resistive element 246 in parallel with series connected adjustable resistive element 248 and adjustable capacitive element 250, which are in turn in parallel with series connected adjustable resistive element 252 and adjustable capacitive element 254. The values of the adjustable resistors and capacitors are controlled by changing register values of a plurality of registers in the feedback loop circuitry 244. The feedback loop of resistive element 246 sets the DC and low frequency gain. Series feedback loops consisting of resistive element 248 and capacitive element 250 and resistive element 252 and capacitive element 254 are adjusted to form a split pair of poles and zeros. The total capacitance of the capacitive elements 250 and 254 set the midband gain and the parallel conductance of the resistive elements 248 and 252 set the high frequency gain. The time constant formed by pole-zero pair elements 248 and 250 can be adjusted independently of the time constant formed by pole-zero pair elements 252 and 254. The time constants are adjusted to provide flatness correction for that portion of the residual error caused by the mismatch of mid and high frequency gains in other portions of the circuit. The resistive element 236 and capacitive element 238 of the shunt pole-zero pair are chosen to set the gain in a narrow band between the low and middle band frequencies and are adjusted to provide flatness correction for that portion of the residual error caused by the mismatch of low and mid frequency gains in other portions of the circuit. Alternately, the resistive element 236 may be adjustable by using a Rejustor™, manufactured and sold by Microbridge Technology Corp., Montreal, Canada. The controller 125 communicates with the feedback loop circuitry 244 via a four line Serial Peripheral Interface bus 260 for loading register values for the adjustable resistive and capacitive elements. The controller 125 would further provide adjustment signals to the resistive element 236 when using a Rejustor™.

FIG. 6 shows representative frequency responses 260, 262 of the signal acquisition system 200 with and without feedback crossover compensation. The capacitance of the capacitive element 212 in the probe tip circuitry 208 of the signal acquisition system 200 is reduced which increases the high frequency input impedance. The reduced capacitance in the probe tip circuitry 208 results in a time constant that is mismatched across the input node 204 with the time constant of the capacitance to ground capacitor 213 of the resistive center conductor signal cable 212 in combination with the input circuitry 226. This breaks the traditional probe-oscilloscope structure where each stage of the signal path is compensated for flat frequency and phase response. The mismatched time constants produce a peak 264 near 8 KHz. A valley 266 near 60 MHz in the frequency response 262 is related to the round-trip reflections in the resistive center conductor signal cable 202 resulting from the termination elements, resistive elements 216, 226 and 230 and capacitive element 228, being only approximations for the complex impedance of the resistive center conductor signal cable 202. The feedback loop circuitry 244 and the series connected resistive and capacitive elements 236 and 238 of the shunt pole-zero pair provide crossover compensation to the peak 264 and valley 266. The 8 KHz peak 264 is corrected by the shunt pole-zero pair of resistive and capacitive elements 236, 238 connected to the input circuitry 224. Generally, the values of resistive and capacitive element 234, 236 are fixed values providing a pole-zero pair. Alternately, the resistive element 236 may be adjustable by using a Rejustor. The controller 125 provides adjustment signals to the resistive element 236 when using a Rejustor. The valley 266 near 60 MHz is caused by the capacitance of the capacitive element 212 being lower than the capacitance of the same capacitor in the traditional probe, and is corrected by changing register values for capacitive elements 250 and 254 with resistive elements 248 and 252 forming a split pair of poles and zeros. The total capacitance of capacitive elements 250 plus 254 sets the midband gain (10 KHz to 10 MHZ), and the parallel conductance of resistive elements 248 and 252 sets the gain above 200 MHZ.

The resistive element 236 and the capacitive element 238 produce a pole-zero pair in the signal acquisition system 200 that flattens the peak 264 near 8 KHz in the frequency response. The transfer function for the low frequency band (DC to midband AC) is shown by Equation 1 below:

$$H(jw) = -\left(\frac{R_{246} \cdot (C_z \cdot A_z \cdot T_z)}{TAC_P \cdot A_P}\right) \quad \text{EQ. 1}$$

where
  $C_z$ represents the Correction Zero pole:
    $(C_{238} \cdot R_{236} \cdot jw+1)$
  $A_z$ represents the Attenuator Zero:
    $(C_{228} \cdot R_{226} \cdot j\omega+1)$
  $T_z$ represents the Tip Zero:
    $(C_{212} \cdot R_{210} \cdot jw+1)$
  $A_p$ represents the Amplifier Poles:
    $((C_{250}+C_{254}) \cdot R_{246} \cdot j\omega+1)$
  $TAC_P$ represent the Tip/Attenuator/Correction Pole:

$(C_{213} \cdot C_{238} \cdot R_{210} \cdot R_{236} \cdot R_{226} +$ $C_{212} \cdot C_{238} \cdot R_{210} \cdot R_{236} \cdot R_{226} + C_{238} \cdot C_{228} R_{210} \cdot R_{236} \cdot R_{226}) \cdot (jw)^2 +$ $(C_{213} \cdot R_{210} \cdot R_{226} + C_{212} \cdot R_{210} \cdot R_{226} + C_{238} \cdot R_{210} \cdot R_{236} + C_{238} \cdot R_{210} \cdot$ $R_{226} + C_{228} \cdot R_{210} \cdot R_{226} + C_{238} \cdot R_{236} \cdot R_{226}) \cdot (jw) + R_{210} + R_{226}$ The shunt pole-zero pair of adjustable resistive element 236 and capacitive element 238 can improve the response over a small band using the Rejustor resistive element 236 but not completely flatten it.

The transfer function for the midband AC to high frequency AC is shown by Equation 2 below:

$$H(jw) = -\left(\frac{A}{B+C}\right) \quad \text{EQ. 2}$$

where A equals:

$$\frac{1}{\left[\left(R_{248} + \frac{1}{C_{250}wj}\right) + \left(R_{252} + \frac{1}{C_{254}wj}\right)\right]}$$

B equals:

$$\left(R_{216} + R_{230} + \frac{1}{C_{228}wj}\right) \cdot \left[\cos(\beta \cdot l) + Y_0 \cdot j \cdot \sin(\beta \cdot l) \cdot \left(R_{214} + \frac{1}{C_{212}wj}\right)\right]$$

C equals:

$$\cos(\beta \cdot l) \cdot \left(R_{214} + \frac{1}{C_{212}wj}\right) + Z_0 \cdot j \cdot \sin(\beta \cdot l)$$

and:

$$\beta = \omega \cdot \sqrt{LC};$$

$$Z_0 = \sqrt{\frac{R + j \cdot w \cdot L}{G + j \cdot w \cdot C}};$$

$$Y_0 = \frac{1}{Z_0};$$

$l$ = electrical length of the cable

The analysis to determine the transfer function through the cable at midband AC to high frequency AC uses a 2-port microwave theory, specifically the ABCD, or transmission matrix. The use of the transmission matrix allows the use of measured data for the cable, since S-parameters can be easily transformed into T-parameters. The transfer function is built up by solving for the port voltages. The 2-port method easily solves the transfer function of the probe tip, cable and attenuator. The active circuit in the signal acquisition system 200 is solved by summing the current at the summing node and assuming an ideal operational amplifier for the input amplifier 234.

The transfer function of Equation 2 indicates that the time delay of the cable causes a pole split between the probe time constant and the attenuator time constant. Traditionally, this pole split is compensated for by choosing values for the probe circuitry time constant that set the poles atop of one another. This has been accomplished using network circuitry in the compensation box at the other end of the probe cable. However, this is at odds with the signal acquisition system 200 concept where the load capacitance in the probe tip circuitry 208 is reduced by lowering the probe tip capacitance and the probe compensation circuitry resides in the signal acquisition system.

The poles may be lined up with each other by increasing the tip resistance but this causes the overall frequency response of the probe-signal processing instrument system to suffer. Other traditional solutions to resolving the midband frequency response flatness requires adjusting cable parameters or removing capacitance in the attenuator to adjust the attenuator time constant. Removing too much capacitance in the attenuator causes the noise gain of the system to suffer and the input amplifier 234 is required to have a higher gain bandwidth. The present invention adds a pole-zero pair in the transfer function to compensate for the split poles by splitting the pole-zero pair in the feedback loop circuitry 244 into two pole-zero pairs (capacitive elements 250, 254 and resistive elements 248 and 252).

The above analysis of the transfer functions for the low frequency band (DC to midband AC) and the midband AC to high frequency AC assumes that there are no parasitic capacitances or inductances and the input amplifier 234 is an ideal amplifier with infinite gain-bandwidth. The resistive elements 214, 230, 248 and 252 in the Equation 2 for the midband AC to high frequency AC are damping resistors in series with the respective capacitive elements 212, 228, 250 and 254. It is assumed at these frequencies (midband AC to high frequency AC) that the conductance of the capacitive elements 212, 228, 250 and 254 are much higher than the large DC resistive elements 210, 226 and 246, resulting in the midband range being a function of capacitance ratio of 212, 228, 250 and 254.

It should be understood that there will be poles due to parasitics and high frequency losses due to skin effects on the cable, as well as zeros from inductive peaking in the ground lead and the various interconnects in the system 200. The input amplifier 234 will have a finite bandwidth and non-zero phase delay. These additional effects will need to be considered in a final design and will affect the chosen component values for the system 200.

Active compensation of the signal acquisition system 200 of the present invention is achieved by electronically varying register values of the resistive and capacitive elements in the feedback loop circuitry 244 of the input amplifier 234 and, if used, the adjustable resistive element 236 in the shunt pole-zero pair. The probe memory 256 may be loaded with typical values associated with a signal acquisition probe, such as input resistance, attenuation factor, dynamic range, bandwidth host resistance, and the like. The probe memory 256 may also be loaded with calibration constants associated with that particular probe at the time of factory calibration. The calibration constants are register values that are combined with existing register value in the feedback loop circuitry 244 of the input amplifier 232 and the adjustable resistive elements 236.

The broad frequency content signal from the signal source 157 is provided internally to at least one of the signal channels of the oscilloscope 100 during factory calibration. The broad frequency content signal is characterized and stored in oscilloscope memory 155 as a CAL REFERENCE WAVEFORM. The characterized waveform may be digitized magnitude values of the broad frequency content signal at selected time locations. Alternately, the characterized waveform may be stored as a time domain mathematical expression associated with amplitude, offset, rise time, overshoot aberrations and the like that would generate a digital waveform of the CAL REFERENCE WAVEFORM. A further alternative is characterizing the CAL REFERENCE WAVEFORM in the frequency domain by performing a Fast Fourier Transform (FFT) on the acquired digital time domain data of the broad frequency content signal.

The oscilloscope memory 155 is loaded with a series of time specific measured error factor tables. Each table defines a time location from a reference time location on the CAL REFERENCE WAVEFORM. Each table has a measured error field having measured error value records, and a corresponding measured error factor field consisting of a register field having register value records for the feedback circuitry 244 and an adjustable resistive element field having resistive element value records for the shunt pole-zero pair, if used. Alternately, the oscilloscope memory 155 may be loaded with a series of frequency specific measured error factor tables where the digital data of the broad frequency content signal has been converted to the frequency domain using an FFT. Each table defines a frequency location on the CAL REFERENCE WAVEFORM. Each table has a measured error field and a measured error factor field with each record of the measured error field having a corresponding record in the measured error factor field. Additionally, multiple specific times error factor tables may be stored in the oscilloscope memory 155. These tables contain multiple time locations from the reference time. The tables have combinations of time locations and associated measured error fields, and a measured error factor field.

Figure 8A:
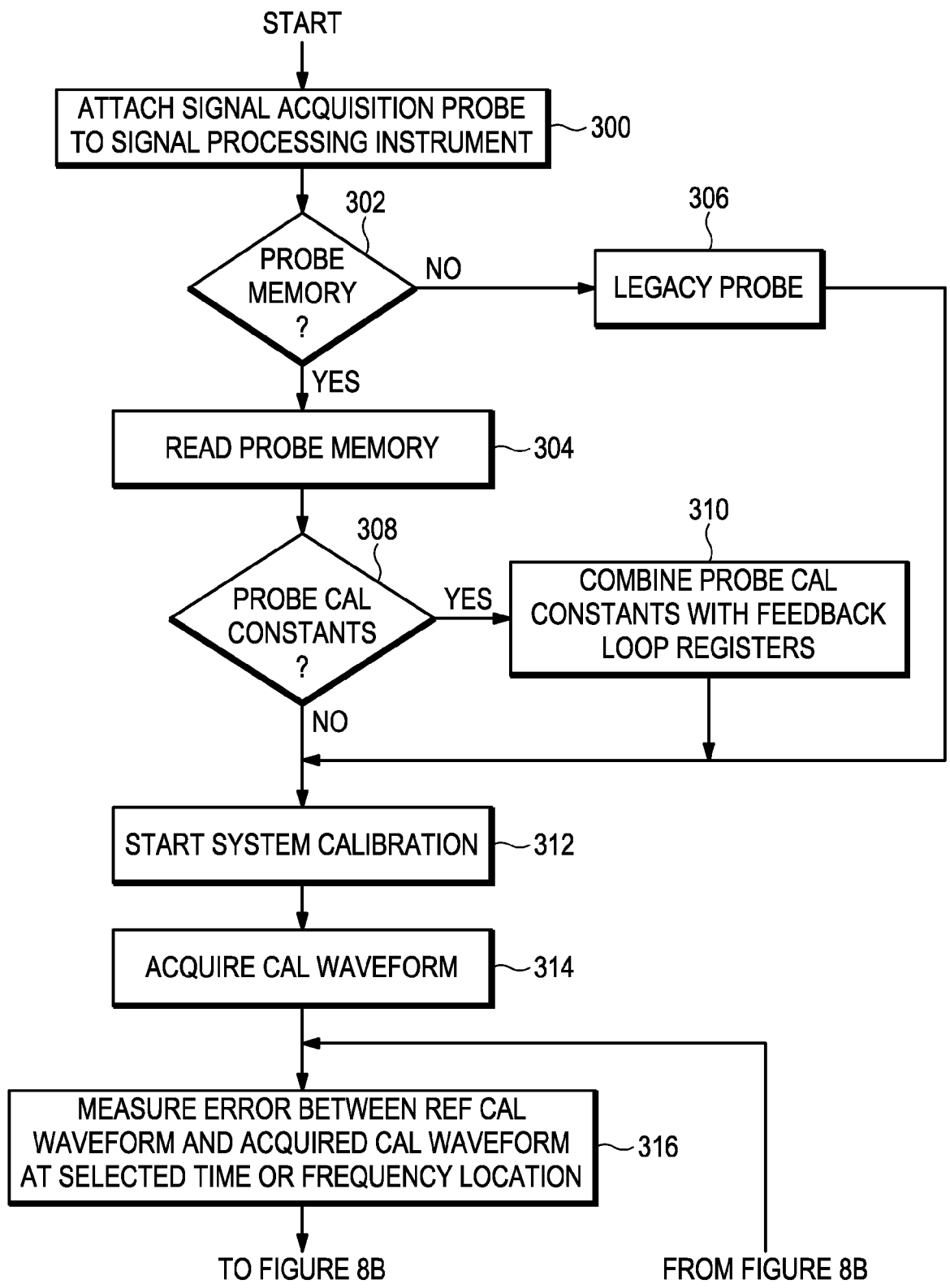
FIGS. 8A and 8B show a calibration process flow chart for calibrating the signal acquisition system of the present invention.
Figure 8B:
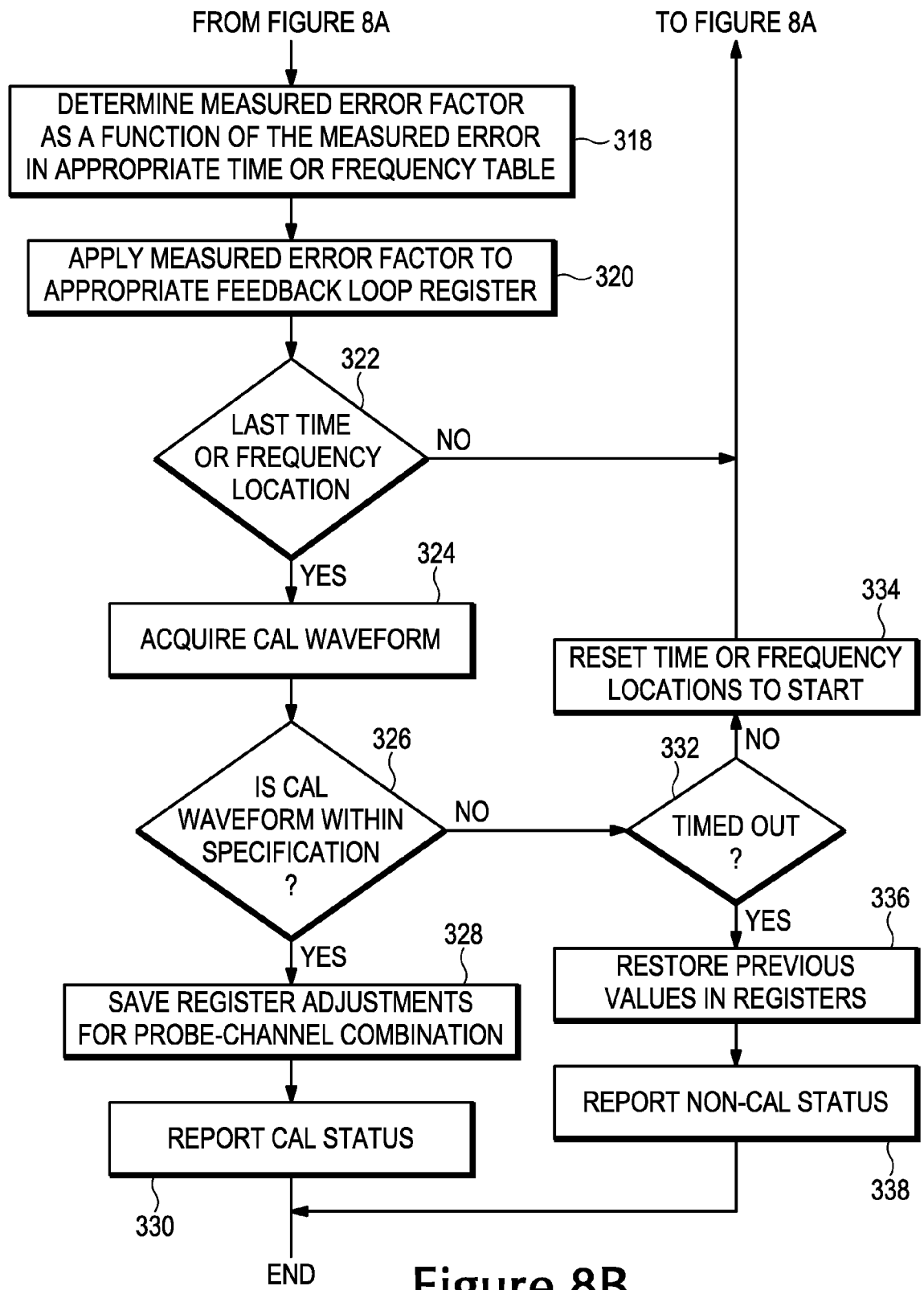

FIGS. 8A and 8B show a calibration process flow chart for calibrating the signal acquisition system 200 of the present invention. Prior to the calibration of the signal acquisition probe 105, DC signal path compensation is performed on the signal channel without the signal acquisition probe 105 attached. The signal acquisition probe 105 is attached to one of the signal channels of the oscilloscope 100 at step 300. The oscilloscope 100 detects the presence of a signal acquisition probe memory 256 at step 302 and reads the contents of the probe memory 256 at step 304. If the oscilloscope 100 does not detect the presence of a signal acquisition probe memory 256, then the attached probe is identified as a legacy probe at step 306. If the probe memory 256 has probe calibration constants as depicted at step 308, then the probe calibration constants are combined with the registers values of the feedback loop circuitry 244 of the input amplifier 232 and the resistive element value 236 at step 310.

A user connects the other end of the signal acquisition probe 105 to the broad frequency content signal source 157 and initiates the probe calibration on the signal channel at step 312 using the display device 135 and instrument controls that may include I/O circuitry, such as a keyboard, mouse or the like. The oscilloscope 100 acquires digital values of the broad frequency content signal as a CAL WAVEFORM at step 314. Alternately, the acquired digital values of the broad frequency content signal may be converted to the frequency domain using an FFT. The error value between the acquired CAL WAVEFORM and the CAL REFERENCE WAVEFORM is measured at a selected time or frequency location as represented in step 316. The measured error factor tables are accessed in step 318 with the selected time or frequency table corresponding to the selected time or frequency of the measured error value being used. The register value and the resistive element 236 value, if used, of the measured error factor are respectively applied to the register of the appropriate feedback loop register and the adjustable resistive element 236 at step 320. The register value of the measured error factor is preferably a value that is multiplied with the current register value of the feedback loop circuitry 240 to generate a new register value. At step 322, a determination is made if the measured error value is at the last time or frequency location of the CAL REFERENCE WAVEFORM. If the calibration process is not at the last time or frequency location of the CAL REFERENCE WAVEFORM, then the process returns to step 316 and the measured error value between the CAL WAVEFORM and the CAL REFERENCE WAVEFORM at the next selected time or frequency location is determined.

If the calibration process has determined the last measured error value between the CAL WAVEFORM and the CAL REFERENCE WAVEFORM, then a new acquisition of digital values of the broad frequency content signal is performed and the digital values are stored as the CAL WAVEFORM as shown in step 324. The just acquired CAL WAVEFORM is compared to calibration specifications to determine if the new CAL WAVEFORM is within the calibration specifications at step 326. The calibration specifications include verifying that the CAL WAVEFORM low frequency compensation measurements are within spec, the peak-to-peak short term aberrations are less than set percentage within a set time span as compared to the CAL REFERENCE WAVEFORM, the peak-to-peak long term aberrations are less than a set percentage within a different set time span as compared to the CAL REFERENCE WAVEFORM, and the rise time is within a set time as compared to the CAL REFERENCE WAVEFORM. If the new CAL WAVEFORM meets the calibration specifications, the register values of the feedback loop circuitry 244 of the input amplifier 234 and the adjustable resistive value 236 are saved for the specific probe and signal channel calibration as shown at step 328. The user is informed that the calibration process has passed by a display output on the display device 135 at step 330 and the calibration process ends.

If the new CAL WAVEFORM does not meet the calibration specification, then the current elapsed time of the calibration process is compared to a iteration time limit value at step 332. If the current elapsed time of the calibration process does not exceed the iteration time limit value, then the time or frequency location of the new CAL REFERENCE WAVEFORM is reset to the start location at step 334 and the process returns to step 316 where measured error values between the CAL REFERENCE WAVEFORM and the new CAL WAVEFORM are determined, the measured error factors are determined and the measured error factors are applied to the register values of the plurality of registers in the feedback loop circuitry 244 of the input amplifier 232 and the adjustable resistive element 236, if used. If the elapsed time of the calibration process exceeds the iteration time limit value, then the initial register values of the feedback loop circuitry 244 and the adjustable resistive element 236 are set as the register values as shown in step 336. The initial register values may be the initial nominal values applied to the registers in the feedback loop circuitry 244 and to the adjustable resistive element 236 without any probe calibration or the previously calibrated register values if the probe and signal channel combination had been previous calibrated. The user is informed of the non-calibration status of the probe-channel combination by a display output on the display device 135 at step 338 and the calibration process ends.

Figure 9:
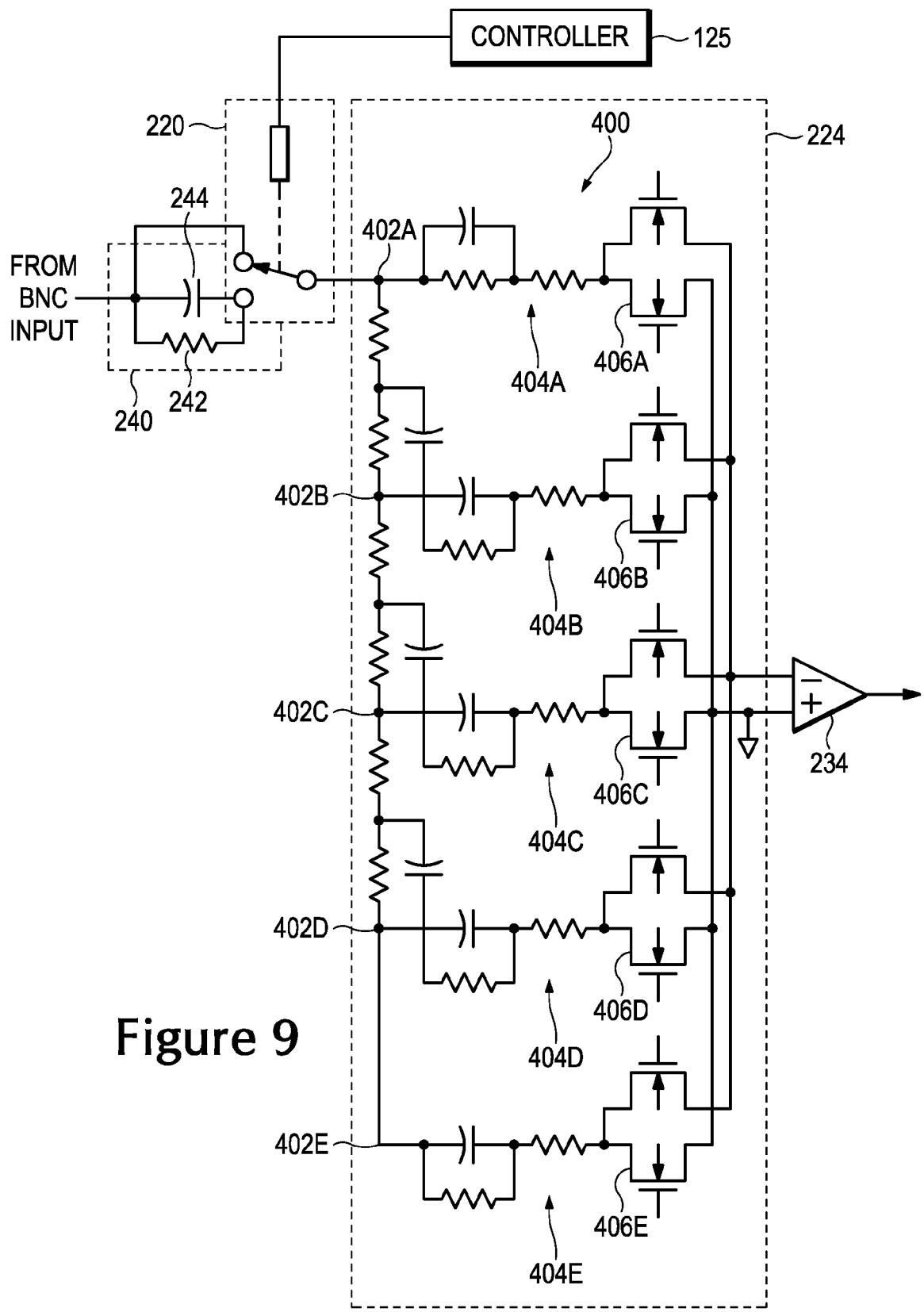
FIG. 9 is a representative schematic of the attenuator circuitry in a signal acquisition system of the present invention.

Referring to FIG. 9, there is shown a representative schematic diagram of the attenuation circuitry 224 as implemented in the signal acquisition system 200 of the present invention. The attenuator circuitry 224 is preferably a multi-stage attenuation ladder 400 with each attenuation stage having an input current node, 402A, 402B, 402C, 402D, 402E. In the preferred embodiment, the multi-stage attenuation ladder 400 has five stages 404A, 404B, 404C, 404D, 404E. The five attenuation stages are by example only and various numbers of stages may be implemented in the multi-stage attenuation ladder 400 without departing from the scope of the claimed invention. The input current to the multi-stage attenuation ladder 400 is received from the signal acquisition probe 105 via the BNC input 204. The input current is sequentially divided at each input current node, 402A, 402B, 402C, 402D, 402E, of each attenuation stage, 404A, 404B, 404C, 404D, 404E. A first portion of the current at each node is coupled through attenuation switches 406A, 406B, 406C, 406D, 406E to the input amplifier 234 or to ground and a remaining portion of the current coupled to the next attenuation stage. For example, the input current entering the current input node 402A is divided so that three-fourths of the current is coupled through the first attenuation stage to the input amplifier 234 or to ground and one-fourth of the current is coupled to the input current node 402B of the next attenuation stage 404B. The one-fourth current entering the current input node 402B of the second attenuation stage 404B is divided so that three-sixteenths of the total input current to the multi-stage attenuation ladder 400 is coupled through the second stage 404B to the input of input amplifier 234 or to ground and one-sixteenth is coupled to the input current node 402C of the next attenuation stage 404C. The one-sixteenth current entering the current input node 402C of the third attenuation stage 404C is divided so that three-sixty-fourths of the total input current to the multi-stage attenuation ladder 400 is coupled through the third stage 404C to the input of input amplifier 234 or to ground and one-sixty-fourth is coupled to the input current node 402D of the next attenuation stage 404D. The one sixty-fourth current entering the input current node 402D is divided so that one-half of the current is coupled through the fourth stage 404D to the input of input amplifier 234 or to ground and one-half is coupled through the fifth stage 404E to the input of the input amplifier 234 or to ground.

Vertical gain settings input by a user are interpreted by the controller 125 for activating and deactivating the attenuation switches 406A, 406B, 406C, 406D, 306E. The current through each of the attenuator stages 404A, 404B, 404C, 404D, 404E may be individually coupled to the input of the input amplifier 234 or the current through multiple stages maybe combined and applied to the input of the input amplifier 234. The input current is not coupled to the input amplifier 234 when implementing "ground" coupling. The attenuation circuitry 224 scales the current to the dynamic range of the input amplifier 234.

Figure 1:
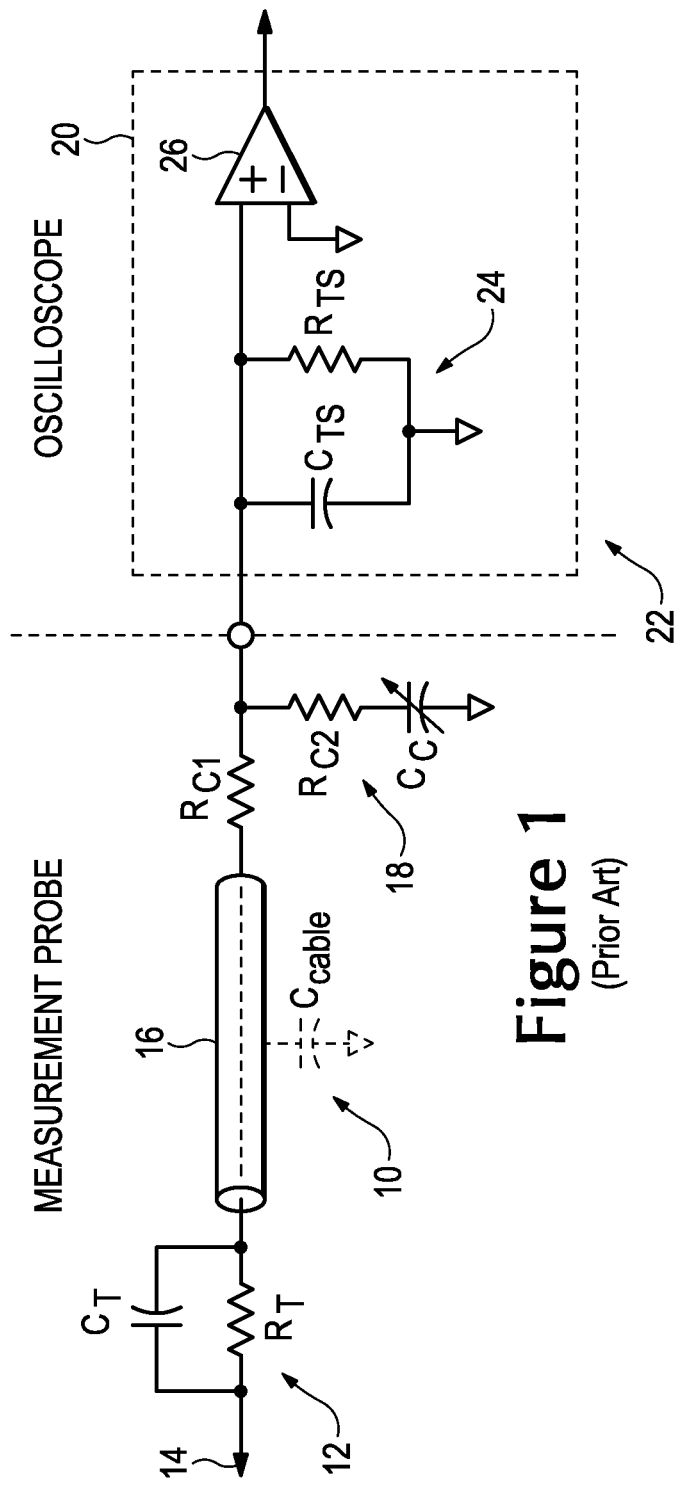
FIG. 1 is a representative schematic diagram of a prior art passive probe.
Figure 2:
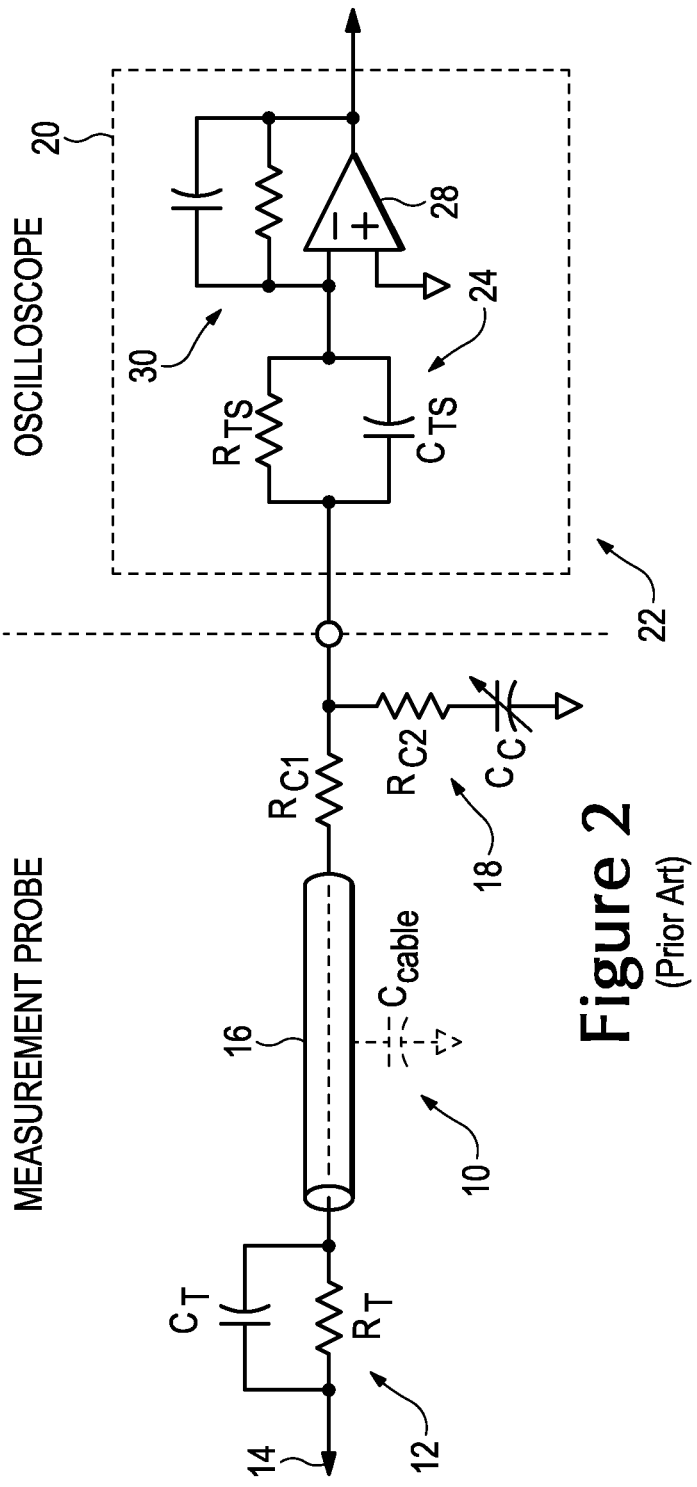
FIG. 2 is representative schematic diagram of another prior art probe circuit.
Figure 3:
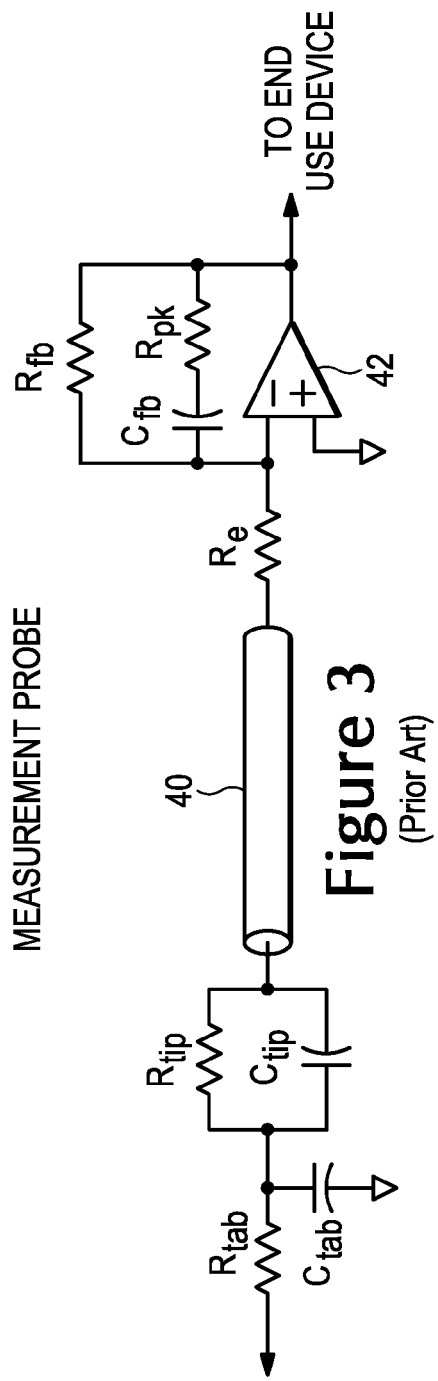
FIG. 3 is representative schematic diagram of a further prior art probe circuit.

The input impedance of the attenuator circuitry 224 for the signal acquisition system 200 is lower than expected by existing passive voltage probes. The shunt impedance of the compensation circuitry 18 in the input box of the prior art probe as illustrated in FIG. 1 is now a series impedance in the signal acquisition system 200. The addition of the selectable resistive-capacitive network 240 in series with the signal acquisition probe 105 and the attenuation circuitry 224 and the simultaneous disconnection of the shunt pole-zero pair of resistive element 236 and capacitive element 238 lowers the input capacitance of the oscilloscope to allow legacy passive voltage probes to be used with the signal acquisition system 200.

Figure 10:
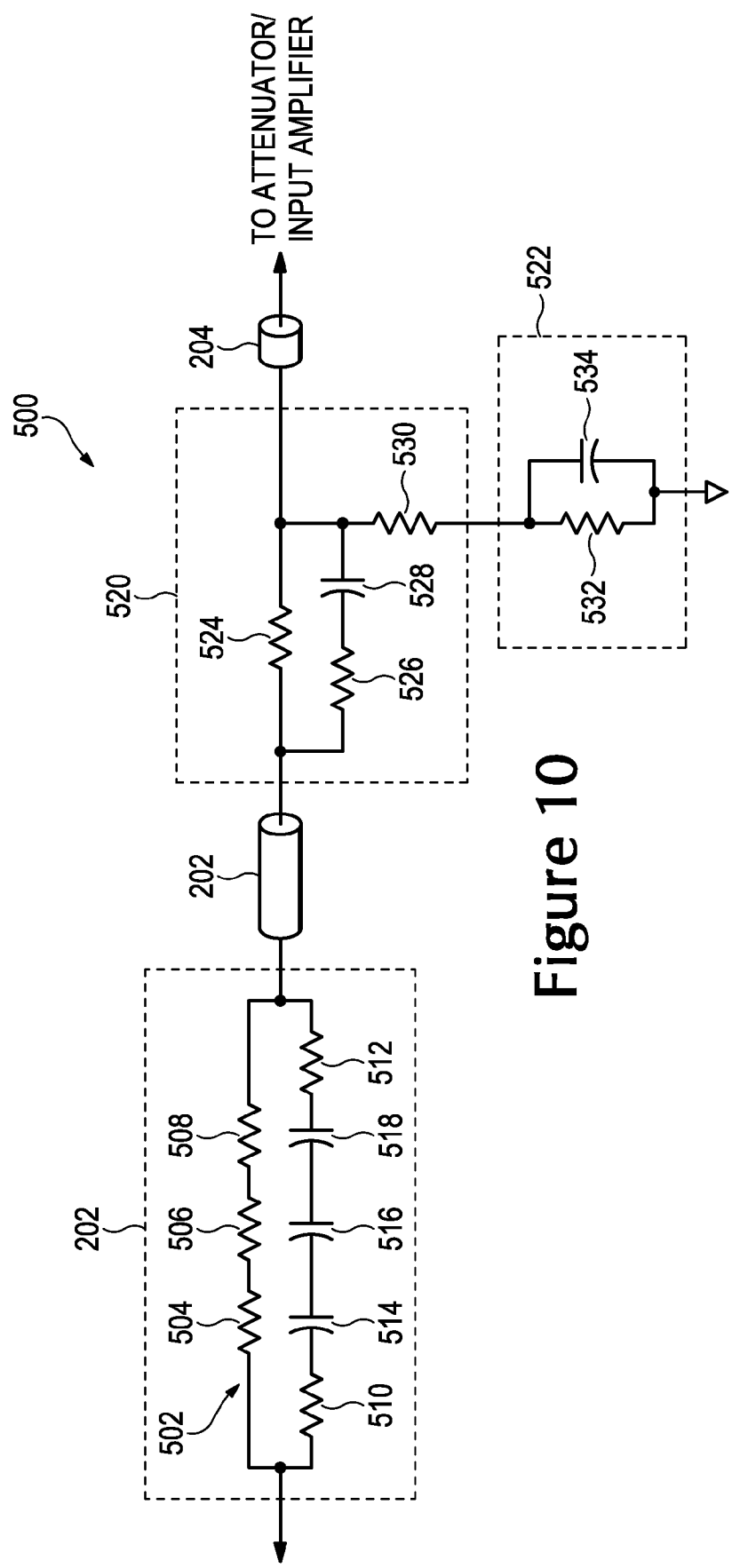
FIG. 10 is a schematic representation of a high voltage signal acquisition probe in the signal acquisition system of the present invention.

Referring to FIG. 10, there is shown a schematic representation of the signal acquisition probe 105 implementing a high voltage probe 500 for the signal acquisition system 200. The high voltage probe 500 has a probing head 202 containing probe tip circuitry 502. The probe tip circuitry 502 has a plurality of series connected resistive elements 504, 506, 508 coupled in parallel with series connected resistive elements 510 and 512 and capacitive elements 514, 516 and 518. The probe tip circuitry is coupled to one end of resistive center conductor cable 202 with the other end of the resistive center conductor cable coupled via coaxial cable termination circuitry 520 to shunt attenuation circuitry 522 and the BNC input 204 of one of the signal acquisition circuitry 115. The cable termination circuitry 520 has resistive element 524 coupled in parallel with resistive element 526 and capacitive element 528 which are in series with resistive element 530. The shunt attenuation circuitry 522 has a resistive element 532 in parallel with a capacitive element 534. The shunt attenuation circuitry 522 functions as a portion of a voltage divider network with the probe tip circuitry 502. In a preferred embodiment, the total series resistance of the probe tip circuitry 502 is approximately 40 MΩ and the shunt resistive element 532 is 1 MΩ which results in a divide by ratio of 40:1 and a total attenuation factor from the probe tip circuitry 502 to the output of the input amplifier 234 times the selected attenuation factor of the attenuation circuitry 224. The voltage divider network of the probe tip circuitry 502 and the shunt attenuation circuitry 522 reduces the high voltage potential at the output of the resistive center conductor cable 202 to provide a safety factor for a user. The resistive center conductor signal cable 202 has dielectric and skin effect losses which may be compensated for by the resistive element 526 and the capacitive element 528 in parallel with the resistive element 524.

It will be obvious to those having skill in the art that many changes may be made to the details of the above-described embodiments of this invention without departing from the underlying principles thereof. For example, the input amplifier 234 is not limited to an inverting amplifier and a non-inverting amplifier may be used without departing from the scope of the claimed invention. Further, the compensation system 232 may be implemented with multi-stage amplifiers where one or more amplifiers provide gain and one or more amplifiers provide the feedback crossover compensation. Additionally, any compensation not performed in using the input amplifier 234 may be shifted several stages later in the signal path, such as after the single-ended-to-differential conversion or the variable gain stages. It should also be noted that steps in calibration process for the signal acquisition system 200 need not be performed in the exact order as described and claimed, and variation in the order of the steps may be implemented without departing from the claims of the invention. Likewise, an iteration count rather than an elapsed time limit may be used to abort a non-converging calibration attempt. The present invention preferably uses registers for varying the resistive and capacitive values of the resistive and capacitive elements in the feedback loop circuitry of the compensation system. However, it is contemplated that by precise laser trimming of the resistive and capacitive components in the signal acquisition system that the use of registers in the feedback loop circuitry may not be needed. The scope of the present invention should, therefore, be determined only by the following claims.

What is claimed is:

1. A calibration process for a signal acquisition system having a signal acquisition probe and a signal processing instrument comprising the steps of:
   a) acquiring digital values of a broad frequency content signal as a calibration waveform using the signal acquisition probe and the signal processing instrument;
   b) determining at least a first a measured error value between a fast edge signal reference calibration waveform stored in the signal processing instrument and the calibration waveform at a common location on the waveforms set by at least one of a time location and a frequency location;
   c) determining the measured error factor as a function of at least the measured error value and the common location on the waveforms;
   d) applying measured error factor to a register value of an appropriate register in a plurality of registers in feedback loop circuitry of an input amplifier;
   e) repeating steps b), c), and d) for additional common locations on the waveforms;
   f) acquiring digital values of a broad frequency content signal as a calibration waveform using the signal acquisition probe and the signal processing instrument after determining the measured error value and measured error factor at the last common location on the waveform;
   g) comparing calibration specifications with the calibration waveform acquired in step f) to verify the calibration waveform is within calibration specifications;
   h) storing register values loaded in the plurality of registers in feedback loop circuitry of an input amplifier for the calibration waveform within calibration specifications; and
   i) displaying successful result of the calibration process.

2. The calibration process for a signal acquisition system having a signal acquisition probe and a signal processing instrument as recited in claim 1 wherein the determining steps b) and c) further comprises the steps of:
   a) determining a plurality of first measured error values between a broad frequency content signal reference calibration waveform stored in the signal processing instrument and the calibration waveform at common locations on the waveforms set by at least one of time locations and frequency locations; and
   b) determining a measured error factor as a function of the plurality of first measured error values and the common locations on the waveforms.

3. The calibration process for a signal acquisition system having a signal acquisition probe and a signal processing instrument as recited in claim 1 wherein the verifying step further comprises the steps of:
   a) determining if the calibration process has exceeded an iteration time limit value;
   b) setting the common location on the waveforms to the initial location when the calibration process has not exceeded the iteration time limit value; and
   c) repeating step e) for the common locations on the waveforms.

4. The calibration process for a signal acquisition system having a signal acquisition probe and a signal processing instrument as recited in claim 3 wherein the determining step of claim 3 further comprises the steps of:
   a) storing initial register values in the plurality of registers in the feedback loop circuitry of an input amplifier prior to the start of the calibration process when the calibration process exceeds the iteration time limit value; and
   b) displaying unsuccessful result of the calibration process.

5. The calibration process for a signal acquisition system having a signal acquisition probe and a signal processing instrument as recited in claim 1 wherein the acquiring step of step a) further comprises the steps of:
   a) attaching the signal acquisition probe to the signal processing instrument;
   b) detecting at least one of the presence or absence of a probe memory in the signal acquisition probe by the signal processing instrument;
   c) loading stored contents of probe memory into the signal processing instrument when the probe memory is present;
   d) detecting probe calibration constants stored in the probe memory;
   e) applying the probe calibration constants to appropriate register values in the plurality of registers in the feedback loop circuitry of an input amplifier; and
   f) identifying the signal acquisition probe as not having a probe memory when the probe memory is absent.

6. The calibration process for a signal acquisition system having a signal acquisition probe and a signal processing instrument as recited in claim 1 wherein the determining step of step b) further comprises the steps of:
 a) converting the digital values of a broad frequency content signal calibration waveform to a frequency domain representation using a Fourier Transform; and
 b) determining a measured error value between a frequency domain representation of a broad frequency content signal reference calibration waveform stored in the signal processing instrument and the frequency domain representation of the calibration waveform at a common location on the waveforms set by a frequency interval.

\* \* \* \* \*

UNITED STATES PATENT AND TRADEMARK OFFICE
CERTIFICATE OF CORRECTION

| | | |
|---|---|---|
| PATENT NO. | : 8,810,258 B2 | Page 1 of 1 |
| APPLICATION NO. | : 13/734345 | |
| DATED | : August 19, 2014 | |
| INVENTOR(S) | : Josiah A. Barlett et al. | |

It is certified that error appears in the above-identified patent and that said Letters Patent is hereby corrected as shown below:

In the specification

In column 3, line 5, replace "$R_{hp}$" with -- $R_{tip}$ --;

In column 3, line 5, replace "$C_{hp}$" with -- $C_{tip}$ --;

In column 5, lines 11-12, replace "in the in" with -- in the --;

In column 5, line 16, replace "in the in" with -- in the --.

Signed and Sealed this
Sixteenth Day of February, 2016

Michelle K. Lee
*Director of the United States Patent and Trademark Office*